(12) United States Patent
Wakana et al.

(10) Patent No.: US 9,661,765 B2
(45) Date of Patent: May 23, 2017

(54) ELECTRONIC CONTROL DEVICE

(71) Applicant: Hitachi Automotive Systems, Ltd., Hitachinaka-shi, Ibaraki (JP)

(72) Inventors: Yoshinori Wakana, Hitachinaka (JP); Masaru Kamoshida, Hitachinaka (JP); Yasuro Kameshiro, Hitachinaka (JP); Takashi Hattori, Hitachinaka (JP); Takashi Igarashi, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 14/439,568

(22) PCT Filed: Oct. 25, 2013

(86) PCT No.: PCT/JP2013/078898
§ 371 (c)(1),
(2) Date: Apr. 29, 2015

(87) PCT Pub. No.: WO2014/069341
PCT Pub. Date: May 8, 2014

(65) Prior Publication Data
US 2015/0305169 A1  Oct. 22, 2015

(30) Foreign Application Priority Data
Nov. 2, 2012  (JP) .................. 2012-242954

(51) Int. Cl.
*H05K 5/00* (2006.01)
*H05K 7/20* (2006.01)
(52) U.S. Cl.
CPC .......... *H05K 5/006* (2013.01); *H05K 5/0056* (2013.01); *H05K 7/20454* (2013.01); *H05K 7/20854* (2013.01)

(58) Field of Classification Search
CPC .... H05K 5/006; H05K 5/0013; H05K 5/0026; H05K 5/0039; H05K 5/0069;
(Continued)

(56) References Cited

U.S. PATENT DOCUMENTS 6,049,469 A * 4/2000 Hood, III ................ G06F 1/182
174/388
7,813,134 B2 * 10/2010 Katsuro ............. H05K 7/20454
165/104.33
(Continued)

FOREIGN PATENT DOCUMENTS

JP  7-183677 A  7/1995
JP  8-18263 A  1/1996
(Continued)

OTHER PUBLICATIONS

International Search Report (PCT/ISA/210) dated Feb. 4, 2014, with English translation (Five (5) pages).
(Continued)

*Primary Examiner* — Tuan T Dinh
*Assistant Examiner* — Mukund G Patel
(74) *Attorney, Agent, or Firm* — Crowell & Moring LLP

(57) ABSTRACT

The invention provides an electronic control device having a high-grade heat sink that: does not require tight control at the time of manufacturing; does not restrict the range of electronic components that can be used; is structurally simple; can be produced at a higher production rate; and is cost-effective. In this device, when a circuit board 14 having an electronic component 13 thereon is placed in a non-metal (resin) housing having: a housing base 11 integrally comprising via a partition wall 11a a connector inserting section 18 used for electrical connection with an external mating connector (not illustrated); and a housing cover 12 attached to the housing base 11, part of the board 14 is inserted into
(Continued)

an insertion hole provided in the partition wall 11a so that it is exposed inside the connector inserting section 16. A pair of elastic metal parts 15, a heat sink, is provided in the housing, connected to the circuit board 14 at particular positions on its top and bottom surfaces with the use of a connecting material 17 (solder or adhesive), and has an arch-shaped cross section as viewed from a lateral direction. The heat of the component 13 is transferred to the housing to dissipate it to the outside by the board 14 being supported from the top and bottom sides in the housing.

13 Claims, 26 Drawing Sheets

(58) Field of Classification Search
CPC ............... H05K 5/0078; H05K 5/0082; H05K 7/20454; H05K 7/20472; H05K 7/20854
USPC .......................... 361/714, 704, 707, 711, 719
See application file for complete search history.

(56) References Cited

U.S. PATENT DOCUMENTS

| | | |
|---|---|---|
| 2005/0270753 A1 | 12/2005 | Morisada |
| 2006/0232940 A1* | 10/2006 | Smirra ................. H05K 7/1418 |
| | | 361/707 |

FOREIGN PATENT DOCUMENTS

| | | |
|---|---|---|
| JP | 9-27688 A | 1/1997 |
| JP | 2005-38975 A | 2/2005 |
| JP | 2006-19674 A | 1/2006 |
| JP | 2009-26870 A | 2/2009 |
| JP | 2009-123812 A | 6/2009 |
| JP | 2011-54895 A | 3/2011 |

OTHER PUBLICATIONS

Japanese language Written Opinion (PCT/ISA/237) dated Feb. 4, 2014 (Four (4) pages).

* cited by examiner

ELECTRONIC CONTROL DEVICE

TECHNICAL FIELD

The present invention relates to an electronic control device having a heat sink for efficiently dissipating heat from the electronic component mounted on the circuit board housed in the device.

BACKGROUND ART

Conventionally, an example of known techniques related to the heat sink structure applied to electronic control devices of this kind is "heat sink structure for electronic components" (see Patent Document 1) in which the lower end of a strip-shaped metal plate having spring properties is fixed to a printed board, the upper end of the metal plate is pressed onto the ceiling of the housing to which to insert the printed board, an electronic component to be mounted on the printed board is attached to the metal plate, the upper end of the metal plate is bent into the shape of '<' in vertical cross section, and one piece of the metal plate on its distal end is in contact with the ceiling of the housing.

Another known technique related to similar heat sink structures is "vehicle-mounted electronic device" (see Patent Document 2) in which multiple printed circuit boards having a particular shape on which electronic components are mounted with a metal plate having a particular shape placed therebetween is attached, these printed circuit boards are electrically connected to each other by external connecting means to form a laminate structure, a connector is connected to one edge of the laminate structure, and all the portion except the front surface of the connector and a particular portion of the metal plate is resin-sealed.

PRIOR ART DOCUMENTS

Patent Documents

Patent Document 1: JP-2011-54895-A
Patent Document 2: JP-1997-27688-A

SUMMARY OF THE INVENTION

Problems to be Solved by the Invention

According to the technique of Patent Document 1, the printed circuit board having an electronic component thereon is fixed to one side of the housing that covers it, the upper end of the metal plate is pressed onto the ceiling of the housing, the lower end of the metal plate is fixed to the printed board, and the top surface of the electronic component is disposed vertically with respect to the printed circuit board. Thus, in order that the metal plate is prevented from being displaced due to the influence of horizontal (lateral) displacement on the printed circuit board, a fixing structure for fixing the printed circuit board and the housing is necessary, complicating the structure of the device. This results in a cost increase and lower productivity. In addition, the application of the electronic component is restricted by the range of the size of the metal plate attachment section in the back height direction of the housing.

In the technique of Patent Document 2, the printed circuit boards on which electronic components are mounted with the metal plate placed therebetween are connected by external flexible connecting means, and the entire portion is resin-sealed. Thus, tight standards control is necessary to ensure the reliability of the basic operation of the electronic components and the connection of the printed circuit boards at the time of manufacturing, and temperature and time need to be controlled tightly in the manufacturing environment to perform quality control. This results in a cost increase and lower productivity.

The present invention has been made to solve the above problems, and its object is to provide an electronic control device having a high-grade heat sink that: does not require tight control at the time of manufacturing; does not restrict the range of electronic components that can be used; is structurally simple; can be produced at a higher production rate; and is cost-effective.

Means for Solving the Problems

To solve the above problems, the invention provides an electronic control device in which a circuit board having an electronic component thereon is mounted in a housing integrally having via a partition wall a connector inserting section used for electrical connection with an external mating connector, wherein part of the circuit board being exposed within the connector inserting section by being inserted into an insertion hole provided in the partition wall, the electronic control device comprising an elastic metal part disposed in the housing, the elastic metal part being connected to a particular position on the circuit board and supporting the circuit board.

Effects of the Invention

In the electronic control device of the invention, because the metal part connected to and supporting the circuit board is disposed in the housing and the device has the function of transferring the heat of the electronic component to the housing to efficiently dissipate it to the outside by the metal part supporting the circuit board in the housing, the invention offers a high-grade heat sink that: does not require tight control at the time of manufacturing; does not restrict the range of electronic components that can be used; is structurally simple; can be produced at a higher production rate; and is cost-effective.

MODE FOR CARRYING OUT THE INVENTION

Electronic control devices according to embodiments of the invention will now be described with reference to the accompanying drawings.

Embodiment 1

Figure 1:
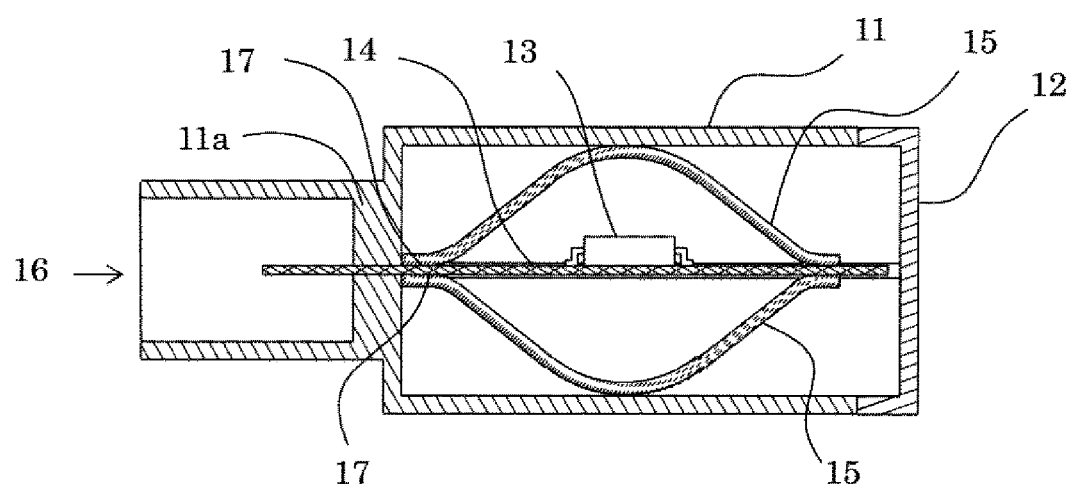
FIG. 1 is a cross-sectional side view illustrating the fundamental structure of an electronic control device according to Embodiment 1 of the invention.
Figure 2:
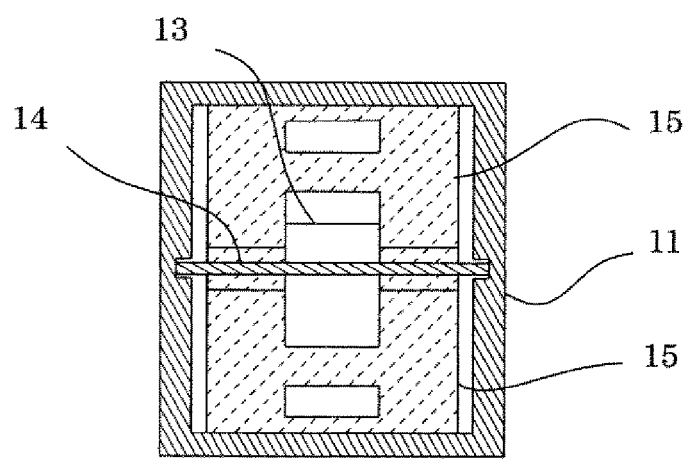
FIG. 2 is a cross section as viewed from an end surface direction of the device of FIG. 1.
Figure 3:
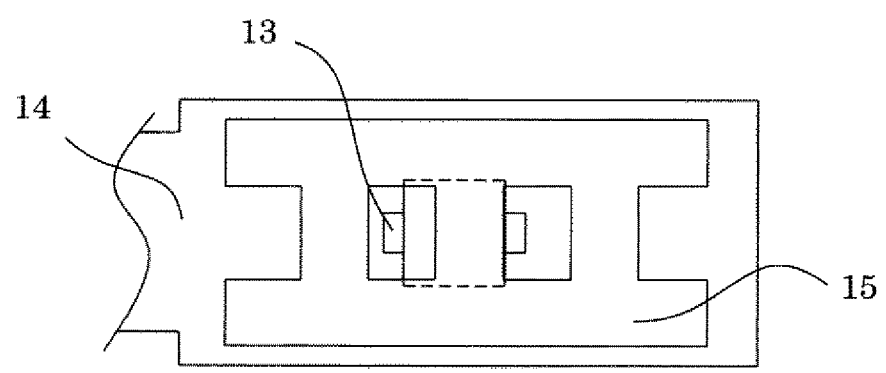
FIG. 3 is a plan view of a circuit board and a metal part placed in the housing of the device of FIG. 1.

FIG. 1 is a cross-sectional side view illustrating the fundamental structure of an electronic control device according to Embodiment 1 of the invention. FIG. 2 is a cross section as viewed from an end surface direction of the device. FIG. 3 is a plan view of a circuit board 14 and a metal part 15 placed in the housing of the device.

The electronic control device has the fundamental structure in which a circuit board 14 having an electronic component 13 thereon is placed in a non-metal (resin) housing having: a housing base 11 integrally comprising via a partition wall 11a a connector inserting section 16 that serves as a male connector used for electrical connection with an external mating connector (female connector) not illustrated; and a housing cover 12 attached to the housing base 11. In addition, the device houses as a heat sink a pair of elastic metal parts 15 attached to the circuit board 14 at particular positions on its top and bottom surfaces (the positions being located on the side of the partition wall 11a) with the use of a connecting material 17 such as solder or adhesive and supporting the circuit board 14 from the top and bottom sides. By supporting the top and bottom surfaces of the circuit board 14 with the pair of metal parts 15 in the housing, the device has the function of transferring the heat of the electronic component 13 to the housing and dissipating it to the outside. Also, inside the connector inserting section 16, an edge of the circuit board 14 is inserted into an insertion hole provided in the partition wall 11a, and part of the electric connection pattern on it is exposed.

Among these components, the housing base 11 integrally having the connector inserting section 16 and the partition wall 11a is open on the edge side across from the partition wall 11a. The housing cover 12 is attached to the opening of the housing base 11 on that edge side. The housing cover 12 is preferably formed of resin, but it can also be formed of metal. An external mating connector to be used for the connector inserting section 16 is a female card-edge connector to be connected to the terminal of the circuit board 14. The pair of the metal parts 15 provided on the top and bottom surfaces (upper and lower positions) of the circuit board 14 are elastic and each have an arch-shaped cross section when viewed from a side surface of the housing base 11. The distal ends of the metal parts 15 on the side of the connector inserting section 16 are fixed to the circuit board 14 at particular positions on its top and bottom surfaces with the use of the connecting material 17 such as solder or adhesive. The apexes of the arches are in contact with inner wall surfaces of the housing base 11, and the other ends of the metal parts 15 are bent and contacted at a position distanced from the particular positions on the top and bottom surfaces of the circuit board 14 with the mounting position of the electronic component 13 placed therebetween, whereby the circuit board 14 is supported. In this state, the metal parts 15 support the circuit board 14 at two locations on one side of the circuit board 14 and are supported at a single location on the side of the housing base 11. In addition, as illustrated in FIGS. 2 and 3, the portions of the metal parts 15 that are located closer to the other portion of the metal parts 15 that are in contact with the circuit board 14 are partially cut off. In addition, the metal parts 15 have windows at positions corresponding to the terminals of the electronic component 13 on the circuit board 14.

Figure 4:
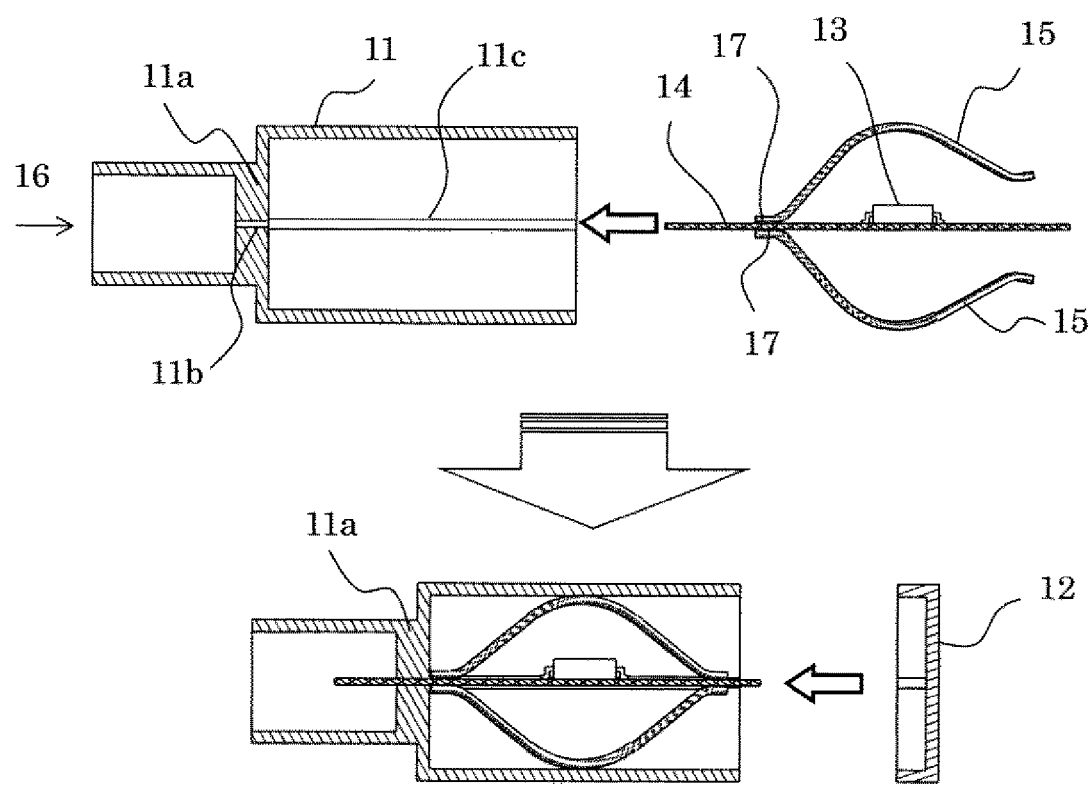
FIG. 4 is an exploded view of the electronic control device of FIG. 1, illustrating how its components are assembled.

FIG. 4 is an exploded view of the electronic control device of Embodiment 1, illustrating how its components are assembled. FIG. 4 illustrates the assembly method in which when the circuit board 14 having the electronic component 13 thereon is inserted into the housing, the electronic component 13 is mounted on the circuit board 14, the circuit board 14 to which the pair of metal parts 15 are fixed at particular positions on its top and bottom surfaces is then slid inside the housing base 11 to insert an edge of the circuit board 14 into the insertion hole 11b of the partition wall 11a so that part of the circuit board 14 is exposed inside the connector inserting section 16, and the housing cover 12 is then attached to the housing base 11. Inner walls of the housing base 11 include guide grooves 11c that support the two lateral edges of the circuit board 14 when the circuit board 14 is slid into the housing base 11. Further, the height of the apexes of the convex sections of the metal parts 15 is set larger than that of the opening of the housing base 11 which is the insertion surface for the circuit board 14 (i.e., than the height of the inner wall surfaces of the housing base 11). Accordingly, when the circuit board 14 is slid into the housing base 11 along the guide grooves 11c on inner wall surfaces of the housing base 11 provided for the circuit board 14 to move it up to the position at which an edge of the circuit board 14 is exposed inside the connector inserting section 16, the convex sections of the pair of metal parts 15 extending from the joint sections of the circuit board 14 on one edge side come into contact with the top and bottom inner wall surfaces of the housing base 11, and the other ends of the metal parts 15 bend inward and come into contact with the top and bottom surfaces of the circuit board 14, thereby supporting the circuit board 14. By then attaching the housing cover 12 to the opening of the housing base 11, the metal parts 15 are prevented from moving in the circuit board inserting direction, whereby the metal parts 14 can stably support the circuit board 14. The housing cover 12 also ensures the sealability (waterproof properties) of the housing.

Figure 5:
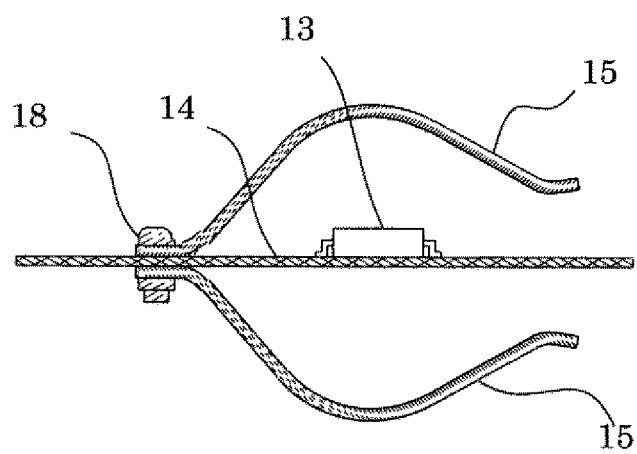
FIG. 5 is a side view illustrating another method in which the circuit board and the metal parts to be placed in the housing of the electronic control device of FIG. 1 are connected by fastening members.

FIG. 5 is a side view illustrating another method in which the circuit board 14 and the metal parts 15 to be placed in the housing of the electronic control device of Embodiment 1 are connected by fastening members. FIG. 5 illustrates the use of fastening members 18 such screws or bolts in place of the connecting material 17 such as solder or adhesive that connects one end side of the metal parts 15 to the circuit board 14 at particular positions on its top and bottom surfaces. In such a case, after one end side of the pair of the metal parts 15 in which holes are punched is brought into contact with and aligned with holes at particular positions on the top and bottom surfaces of the circuit board 14 in such a way as to sandwich the circuit board 14, they can be fastened together with the fastening members 18. That is, in the electronic control device of Embodiment 1, either the connecting material 17 or the fastening members 18 can be used to connect the metal parts 15 to the circuit board 14.

In the heat sink structure of the electronic control device of Embodiment 1, the pair of metal parts 15 connected to the top and bottom surfaces of the circuit board 14 and supporting the circuit board 14 from the top and bottom sides is disposed in the housing, and the function of transferring the heat of the electronic component 13 to the housing to efficiently dissipate it to the outside is obtained by the metal parts 15 supporting the top and bottom surfaces of the circuit board 14 in the housing. Thus, Embodiment 1 offers a high-grade heat sink that: does not require tight control at the time of manufacturing; does not restrict the range of electronic components that can be used; is structurally simple; can be produced at a higher production rate; is cost-effective; and has sufficient sealability (waterproof properties). It should be noted that the heat sink structure of Embodiment 1 can also be applied to a case where the circuit board 14 is placed upside down in the housing so that the electronic component 13 faces downward.

Embodiment 2

Figure 6:
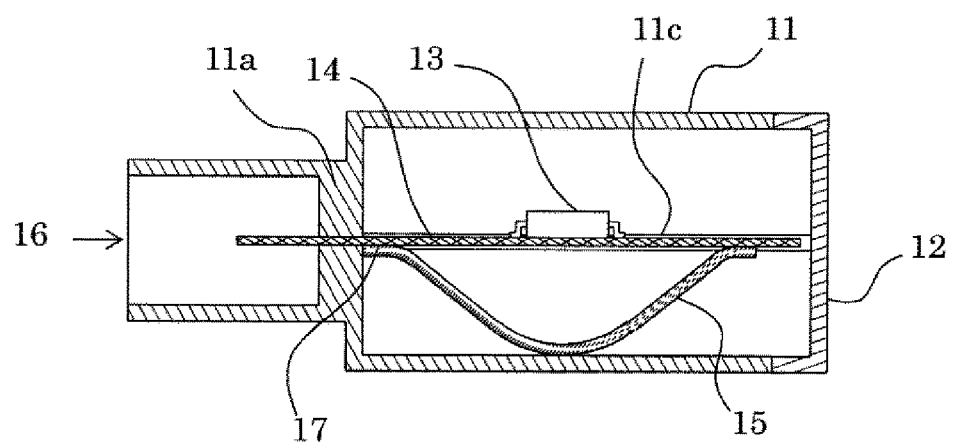
FIG. 6 is a cross-sectional side view illustrating the fundamental structure of an electronic control device according to Embodiment 2 of the invention.
Figure 7:
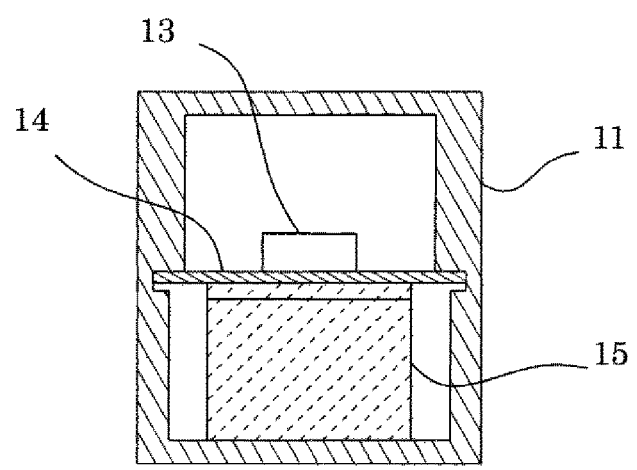
FIG. 7 is a cross section as viewed from an end surface direction of the device of FIG. 6.

FIG. 6 is a cross-sectional side view illustrating the fundamental structure of an electronic control device according to Embodiment 2 of the invention. FIG. 7 is a cross section as viewed from an end surface direction of the device. The electronic control device of Embodiment 2 differs from that of Embodiment 1 shown in FIG. 1 in that it includes as a heat sink a single elastic metal part 15 attached to the circuit board 14 at a particular position on its bottom surface (the position being located on the side of the partition wall 11a) with the use of the connecting material 17 such as solder or adhesive and supporting the circuit board 14 from the bottom side and has the function of transferring the heat of the electronic component 13 to the housing to dissipate it to the outside by the single metal part 15 supporting the bottom surface of the circuit board 14 in the housing.

Figure 8:
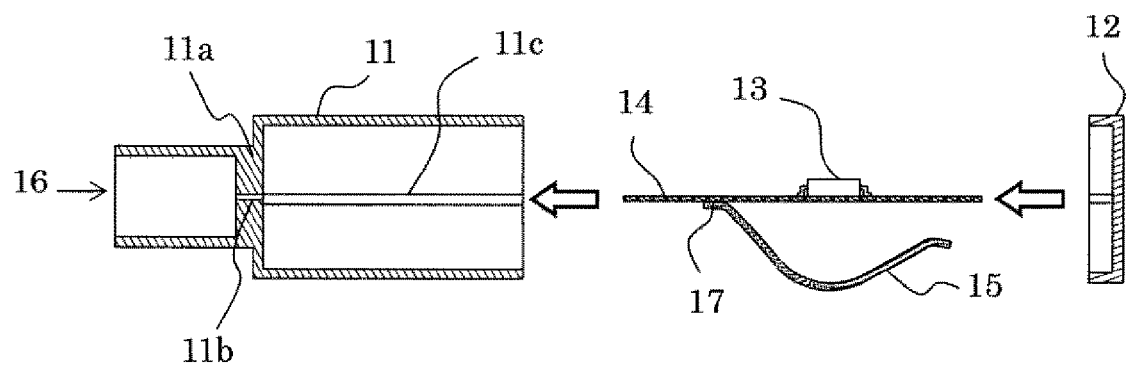
FIG. 8 is an exploded view of the electronic control device of FIG. 6, illustrating how its components are assembled.

FIG. 8 is an exploded view of the electronic control device of Embodiment 2, illustrating how its components are assembled. FIG. 8 illustrates the assembly method in which when the circuit board 14 having the electronic component 13 thereon is inserted into the housing, the electronic component 13 is mounted on the circuit board 14, the circuit board 14 to which the metal part 15 is fixed at a particular position on its bottom surfaces is then slid inside the housing base 11 along the guide grooves 11c to insert an edge of the circuit board 14 into the insertion hole 11b of the partition wall 11a so that part of the circuit board 14 is exposed inside the connector inserting section 16, and the housing cover 12 is then attached to the housing base 11. In this embodiment as well, the height of the apex of the convex section of the metal part 15 is set larger than the lower height of the opening of the housing base 11 which is the insertion surface of the circuit board 14 (i.e., than the lower height of inner wall surfaces of the housing base 11). Accordingly, when the circuit board 14 is slid into the housing base 11 along the guide grooves 11c to move it up to the position at which an edge of the circuit board 14 is exposed inside the connector inserting section 16, the convex section of the metal part 15 extending from the bottom-side joint section of the circuit board 14 on one edge side comes into contact with the bottom inner wall surface of the housing base 11, and the other end of the metal parts 15 bends inward and comes into contact with the bottom surface of the circuit board 14, thereby supporting the circuit board 14. By then attaching the housing cover 12 to the opening of the housing base 11, the metal part 15 is prevented from moving in the circuit board inserting direction, whereby the metal part 14 can stably support the circuit board 14. The housing cover 12 also ensures the sealability (waterproof properties) of the housing.

Figure 9:
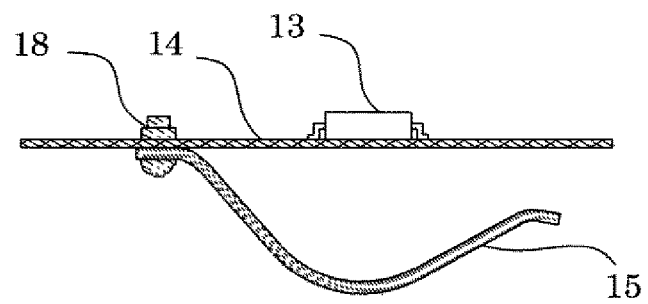
FIG. 9 is a side view illustrating another method in which the circuit board and the metal part to be placed in the housing of the electronic control device of FIG. 6 are connected by fastening members.

FIG. 9 is a side view illustrating another method in which the circuit board 14 and the metal part 15 to be placed in the housing of the electronic control device of Embodiment 2 are connected by fastening members. FIG. 5 illustrates the use of fastening members 18 such screws or bolts in place of the connecting material 17 such as solder or adhesive that connects one end side of the metal part 15 to the circuit board 14 at a particular position on its bottom surface. In such a case, after one end side of the metal part 15 in which holes are punched is brought into contact with and aligned with holes at particular positions on the bottom surface of the circuit board 14, they can be fastened together with the fastening members 18. That is, in the electronic control device of Embodiment 2, too, either the connecting material 17 or the fastening members 18 can be used to connect the metal part 15 to the circuit board 14.

In the heat sink structure of the electronic control device of Embodiment 2, the metal part 15 connected to the bottom surface of the circuit board 14 and supporting the circuit board 14 from the bottom side is disposed in the housing, and the function of transferring the heat of the electronic component 13 to the housing to efficiently dissipate it to the outside is obtained by the metal part 15 supporting the bottom surface of the circuit board 14 in the housing. Although the heat sink structure of Embodiment 2 has somewhat lower heat dissipating capabilities than that of Embodiment 1, Embodiment 2 allows the use of a wider range of electronic components than Embodiment 1 since no metal part 15 is present on the top surface of the circuit board 14. In addition, similar to Embodiment 1, Embodiment 2 offers a high-grade heat sink that: does not require tight control at the time of manufacturing; is structurally simple; can be produced at a higher production rate; is cost-effective; and has sufficient sealability (waterproof properties). It should be noted that in the heat sink structure of Embodiment 2, the metal part 15 can instead be provided on the top surface of the circuit board 14, or the circuit board 14 can instead be placed upside down in the housing so that the electronic component 13 faces downward.

Embodiment 3

Figure 10:
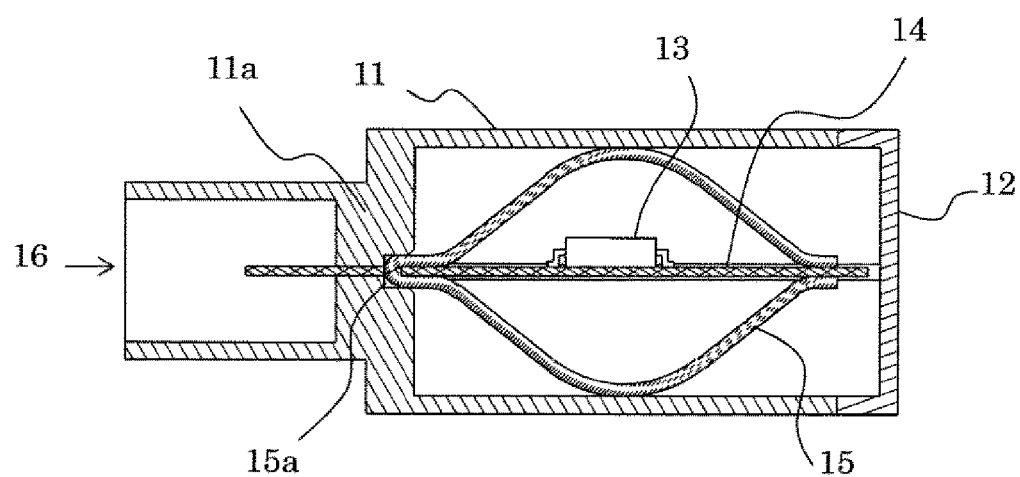
FIG. 10 is a cross-sectional side view illustrating the fundamental structure of an electronic control device according to Embodiment 3 of the invention.

FIG. 10 is a cross-sectional side view illustrating the fundamental structure of an electronic control device according to Embodiment 3 of the invention. The electronic control device of Embodiment 3 differs from that of Embodiment 1 shown in FIG. 1 in that it includes as a heat sink a single elastic metal part 15 having U-shaped bent sections 15a that engage with the edge of the circuit board 14 on the side of the partition wall 11a (the insertion side), the metal part 15 supporting the circuit board 14 from the top and bottom sides, and the device has the function of transferring the heat of the electronic component 13 to the housing to dissipate it to the outside by the single metal part 15 supporting the top and bottom surfaces of the circuit board 14 in the housing.

Figure 11:
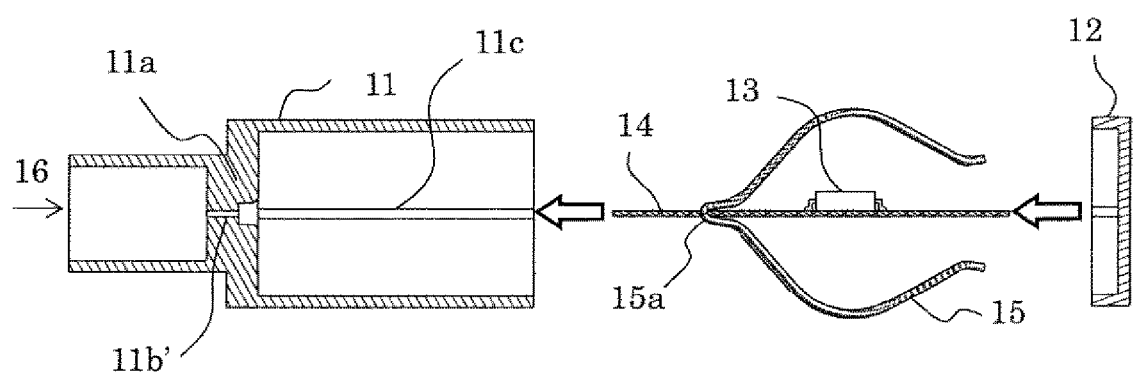
FIG. 11 is an exploded view of the electronic control device of FIG. 10, illustrating how its components are assembled.

FIG. 11 is an exploded view of the electronic control device of Embodiment 3, illustrating how its components are assembled. FIG. 11 illustrates the assembly method in which when the circuit board 14 having the electronic component 13 thereon is inserted into the housing, particular positions at the insertion-side edge of the circuit board 14 having the electronic component 13 is brought into contact with and engaged with the bent sections 15a of the metal part 15, the circuit board 14 and the metal part 15 are then slid inside the housing base 11 along the guide grooves 11c, the bent sections 15a and an edge of the circuit board 14 are then inserted into the insertion hole 11b' of the partition wall 11a that has a larger section provided for the bent sections 15a of the metal part 15 so that part of the circuit board 14 is exposed inside the connector inserting section 16, and the housing cover 12 is then attached to the housing base 11. In this embodiment as well, the height of the apexes of the convex sections of the metal part 15 is set larger than that of the opening of the housing base 11 which is the insertion surface of the circuit board 14 (i.e., than the height of inner wall surfaces of the housing base 11). Accordingly, when the circuit board 14 is slid into the housing base 11 along the guide grooves 11c on inner wall surfaces of the housing base 11 that guide the circuit board 14 to move it up to the position at which an edge of the circuit board 14 is exposed inside the connector inserting section 16, the convex sections of the metal part 15 extending from the joint section of the circuit board 14 on one edge side come into contact with the top and bottom inner wall surfaces of the housing base 11, and the other ends of the metal part 15 bend inward and come into contact with the top and bottom surfaces of the circuit board 14, thereby supporting the circuit board 14. By then attaching the housing cover 12 to the opening of the housing base 11, the metal part 15 is prevented from moving in the circuit board inserting direction, whereby the metal part 14 can stably support the circuit board 14. The housing cover 12 also ensures the sealability (waterproof properties) of the housing.

Figure 12:
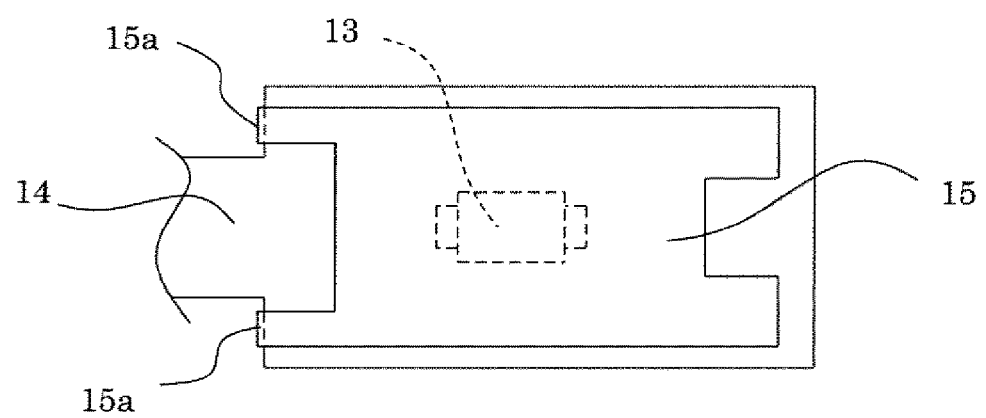
FIG. 12 is a plan view of a circuit board and a metal part placed in the housing of the device of FIG. 10.

FIG. 12 is a plan view of the circuit board 14 and the metal part 15 placed in the housing of the device of Embodiment 3. As illustrated in FIG. 12, the portions of the metal part 15 that are located closer to the other portion of the metal parts 15 that are in contact with the circuit board 14 are partially cut off, as is similar to Embodiment 1 (FIG. 3). However, unlike Embodiment 1, the metal part 15 of Embodiment 3 has no window at positions corresponding to the terminals of the electronic component 13 on the circuit board 14. In addition, unlike Embodiment 1, the top and bottom sides of the metal part 15 of Embodiment 3 are continuous at two locations distanced from each other at the inserting-side edge of the circuit board 14.

In the heat sink structure of the electronic control device of Embodiment 3, the metal part 15 bent at the bent sections 15a in such a way as to stride across the top and bottom surfaces of the circuit board 14, engaged with an edge of the circuit board 14, and supporting the top and bottom surfaces of the circuit board 14 is disposed in the housing, and the function of transferring the heat of the electronic component 13 to the housing to efficiently dissipate it to the outside is obtained by the metal part 15 simultaneously supporting the top and bottom surfaces of the circuit board 14 in the housing. Since Embodiment 3 does not involve the use of the connecting material 17 nor the fastening members 18 unlike Embodiments 1 and 2, the electronic control device of Embodiment 3 can be produced more easily, at a higher production rate, and at lower costs, without requiring tight control at the time of manufacturing. Also, similar to Embodiment 1, Embodiment 3 results in a high-grade heat sink structure having sufficient sealability (waterproof properties). It should be noted that the heat sink structure of Embodiment 3 can also be applied to a case where the circuit board 14 is placed upside down in the housing so that the electronic component 13 faces downward.

Figure 13:
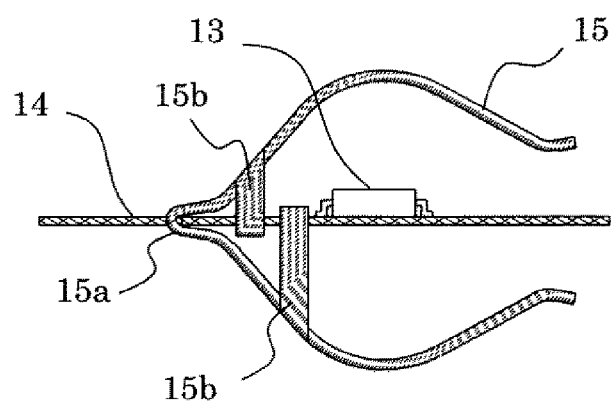
FIG. 13 is a side view illustrating an example of engaging the metal part of FIG. 10 with the circuit board by deforming the metal part.
Figure 14:
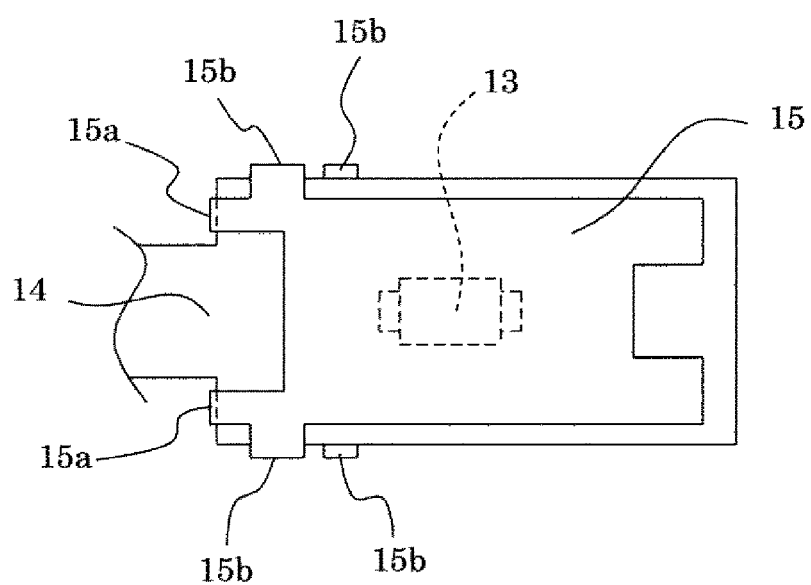
FIG. 14 is a plan view of the circuit board and the metal part shown in FIG. 13.

The metal part 15 of Embodiment 3 can be deformed to prevent its displacement when the circuit board 14 is slid into the housing. FIG. 13 is a side view illustrating an example of engaging the metal part 15 with the circuit board 14 by deforming the metal part 15 while FIG. 14 is a plan view illustrating the circuit board 14 and the deformed metal part 15. As illustrated, in addition to the two bent sections 15a distanced from each other at the inserting-side edge of the circuit board 14, the metal part 15 further includes four anti-displacement bent sections 15b extending from the lateral sides of the metal part 15, two of which are bent downward at positions closer to the bent sections 15a, the other two of which are bent upward at positions farther away from the bent sections 15a. The four anti-displacement bent sections 15b are positioned such that they come into contact with the lateral sides of the circuit board 14 at different positions. It should be noted that the bending direction can be reversed. The anti-displacement bent sections 15b prevent the metal part 15 from moving in lateral directions and in the circuit board inserting direction when the circuit board 14 is slid into the housing, thus ensuring accurate assembly. Such anti-displacement bent sections can also be applied to the metal parts of all the embodiments of the invention except Embodiments 5 and 6.

Embodiment 4

Figure 15:
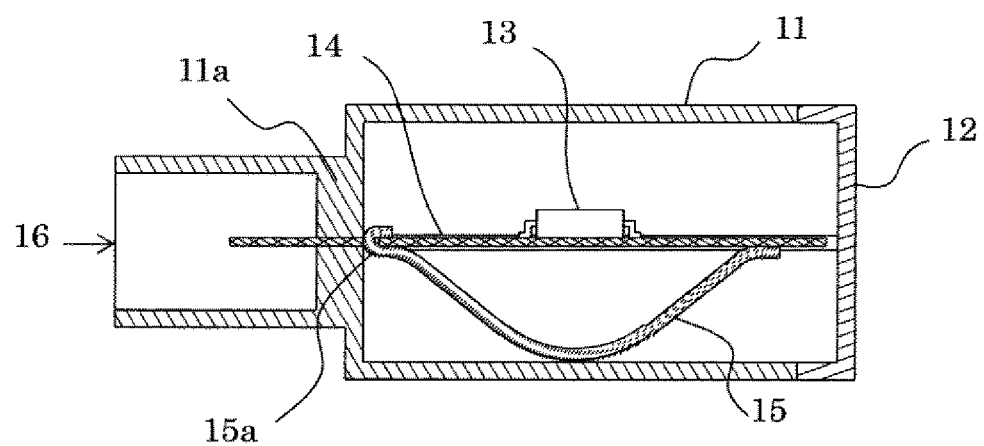
FIG. 15 is a cross-sectional side view illustrating the fundamental structure of an electronic control device according to Embodiment 4 of the invention.

FIG. 15 is a cross-sectional side view illustrating the fundamental structure of an electronic control device according to Embodiment 4 of the invention. The electronic control device of Embodiment 4 differs from that of Embodiment 3 shown in FIG. 10 in that it includes as a heat sink a single elastic metal part 15 having U-shaped bent sections 15a that engage with the edge of the circuit board 14 on the side of the partition wall 11a (the insertion side), the metal part 15 supporting the circuit board 14 from the bottom side, and the device has the function of transferring the heat of the electronic component 13 to the housing to dissipate it to the outside by the single metal part 15 supporting the bottom surface of the circuit board 14 in the housing.

In the heat sink structure of the electronic control device of Embodiment 4, the single metal part 15 connected at the bent sections 15a in such a way as to stride across the bottom surface of the circuit board 14 and supporting the bottom surface of the circuit board 14 is disposed in the housing, and the function of transferring the heat of the electronic component 13 to the housing to efficiently dissipate it to the outside is obtained by the metal part 15 supporting the bottom surface of the circuit board 14 in the housing. Although the heat sink structure of Embodiment 4 has somewhat lower heat dissipating capabilities than that of Embodiment 3, Embodiment 4 allows the use of a wider range of electronic components than Embodiment 3 since no metal part is present on the top surface of the circuit board 14. In addition, since Embodiment 4 does not involve the use of the connecting material 17 nor the fastening members 18 unlike Embodiments 1 and 2, the electronic control device of Embodiment 3 can be produced more easily, at a higher production rate, and at lower costs without requiring tight control at the time of manufacturing and can achieve sufficient sealability (waterproof properties). It should be noted that in the heat sink structure of Embodiment 4, the metal part 15 can instead be provided on the top surface of the circuit board 14, or the circuit board 14 can instead be placed upside down in the housing so that the electronic component 13 faces downward.

Embodiment 5

Figure 16:
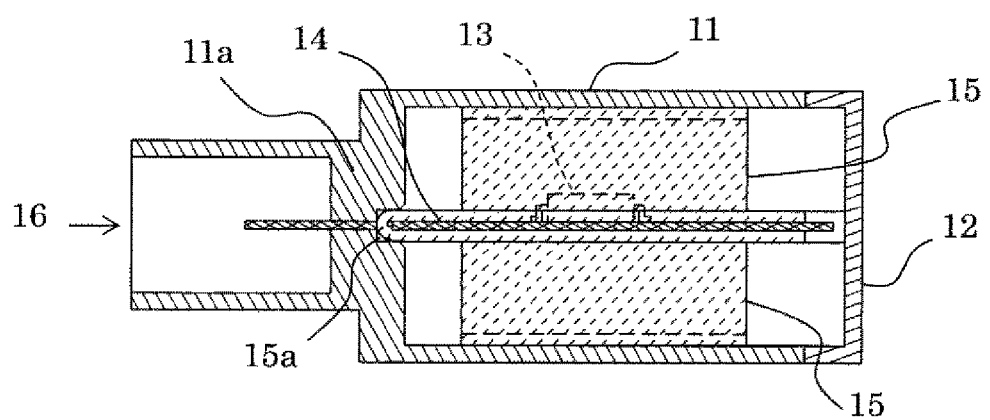
FIG. 16 is a cross-sectional side view illustrating the fundamental structure of an electronic control device according to Embodiment 5 of the invention.
Figure 17:
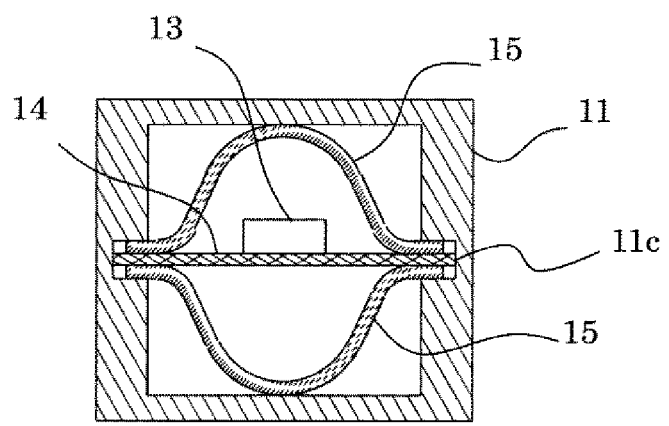
FIG. 17 is a cross section as viewed from an end surface direction of the device of FIG. 16.

FIG. 16 is a cross-sectional side view illustrating the fundamental structure of an electronic control device according to Embodiment 5 of the invention. FIG. 17 is a cross section as viewed from an end surface direction of the device. The device of Embodiment 5 differs from that of Embodiment 1 in that it includes as a heat sink a metal part 15 that is slid into the housing base 11 with the metal part 15 sandwiching the lateral edges of the top and bottom surfaces of the circuit board 14, and the metal part 15 is elastic, has an arch-shaped cross section as viewed from an end surface direction of the housing base 11, extends also in a side surface direction of the housing base 11, and has bent sections 15a at two locations distanced from each other at the insertion-side edge of the circuit board.

Figure 18:
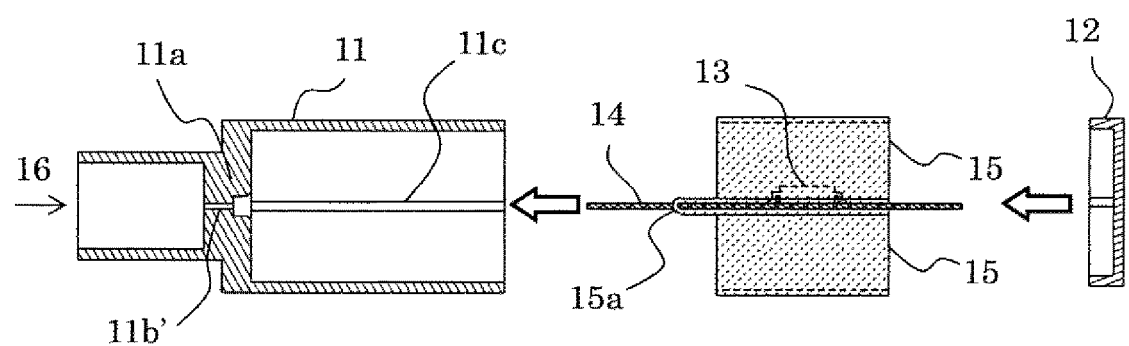
FIG. 18 is an exploded view of the electronic control device of FIG. 16, illustrating how its components are assembled.

FIG. 18 is an exploded view of the electronic control device of Embodiment 5, illustrating how its components are assembled. FIG. 18 illustrates the assembly method in which when the circuit board 14 on which the electronic component 13 is mounted is inserted into the housing, the circuit board 14 on which the electronic component 13 is mounted is inserted into the space of the metal part 15, particular positions at the insertion-side edge of the circuit board 14 are then brought into contact with and engaged with the bent sections 15a of the metal part 15, the circuit board 14 and the metal part 15 are then slid inside the housing base 11 along the guide grooves 11c, the bent sections 15a and an edge of the circuit board 14 are then inserted into the insertion hole 11b' of the partition wall 11a that has a larger section provided for the bent sections 15a of the metal part 15 so that part of the circuit board 14 is exposed inside the connector inserting section 16, and the housing cover 12 is then attached to the housing base 11. In this embodiment as well, the height of the apexes of the convex sections of the metal part 15 is set larger than that of the opening of the housing base 11 which is the insertion surface of the circuit board 14 (i.e., than the height of inner wall surfaces of the housing base 11). Accordingly, when the circuit board 14 and the metal part 15 are slid along the guide grooves 11c on inner wall surfaces of the housing base 11 that guide the circuit board 14 to move it up to the position at which an edge of the circuit board 14 is exposed inside the connector inserting section 16, the convex sections of the metal part 15 come into contact with the top and bottom inner wall surfaces of the housing base 11, and the other ends of the metal part 15 bend slightly inward and come into contact with the top and bottom surfaces of the circuit board 14, thereby being supported by inner side walls of the housing base 11. By then attaching the housing cover 12 to the opening of the housing base 11, the metal part 15 is prevented from moving in the circuit board inserting direction, whereby the metal part 15 can stably support the circuit board 14. The housing cover 12 also ensures the sealability (waterproof properties) of the housing.

Figure 19:
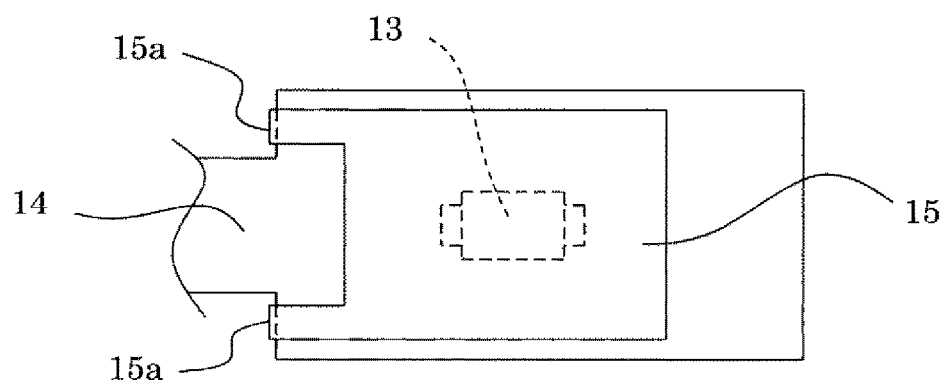
FIG. 19 is a plan view of a circuit board and a metal part placed in the housing of the device of FIG. 16.

FIG. 19 is a plan view of the circuit board 14 and the metal part 15 placed in the housing of the device of Embodiment 5. As illustrated in FIG. 19, the portions of the metal part 15 that are located closer to the partition wall 11a are partially cut off, as is similar to the metal parts 15 of Embodiment 1 shown in FIG. 3. However, unlike Embodiment 1, the metal part 15 of Embodiment 3 has no window at positions corresponding to the terminals of the electronic component 13 on the circuit board 14, and the circuit board 14 is inserted into the space created at the two mutually distant bent sections 15a with which the inserting-side edge of the circuit board 14 is brought into contact.

In the heat sink structure of the electronic control device of Embodiment 5, the single metal part 15 sandwiching the lateral edges of the top and bottom surfaces of the circuit board 14, bent at the bent sections 15a in such a way as to stride across the top and bottom surfaces of the circuit board 14, engaged with an edge of the circuit board 14, and supporting the circuit board 14 from the top and bottom sides is disposed in the housing, and the function of transferring the heat of the electronic component 13 to the housing to efficiently dissipate it to the outside is obtained by the metal parts 15 simultaneously supporting the top and bottom surfaces of the circuit board 14 in the housing. Since Embodiment 5 does not involve the use of the connecting material 17 nor the fastening members 18 similar to Embodiment 3, the electronic control device of Embodiment 5 can be produced more easily, at a higher production rate, and at lower costs, without requiring tight control at the time of manufacturing. Also, similar to Embodiment 1, Embodiment 5 results in a high-grade heat sink structure having sufficient sealability (waterproof properties). It should be noted that the heat sink structure of Embodiment 5 can also be applied to a case where the circuit board 14 is placed upside down in the housing so that the electronic component 13 faces downward.

Embodiment 6

Figure 20:
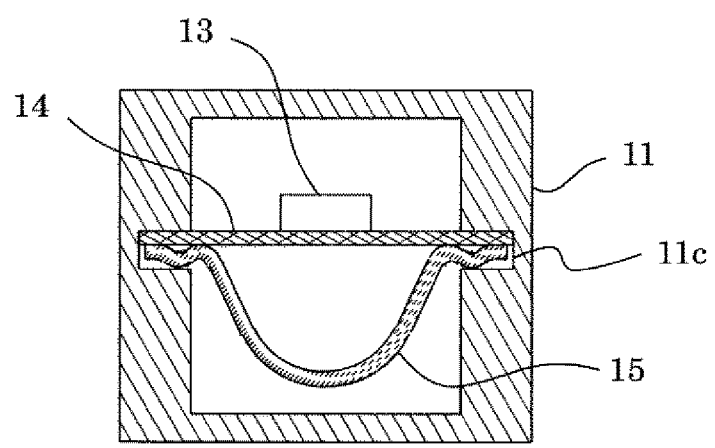
FIG. 20 is a cross section as viewed from an end surface direction of an electronic control device according to Embodiment 6 of the invention.

FIG. 20 is a cross section as viewed from an end surface direction of an electronic control device according to Embodiment 6 of the invention. The electronic control device of Embodiment 6 differs from the structure of Embodiment 5 shown in FIGS. 16 through 19 in that it includes as a heat sink a metal part 15, both edges of which are deformed into concave and convex shapes and are elastic with respect to the guide grooves 11c inside the housing base 11 along which the circuit board 14 is slid, in that the metal part 15 has no bent sections 15*a*, and in that the metal part 15 is provided on the bottom side of the circuit board 14.

In the heat sink structure of the electronic control device of Embodiment 6, the metal part 15 pressure-bonded to the side-directional bottom surface edge of the circuit board 14 within the guide grooves 11*c* and supporting the bottom surface of the circuit board 14 is disposed in the housing, and the function of transferring the heat of the electronic component 13 to the housing to efficiently dissipate it to the outside is obtained by the metal part 15 supporting the bottom surface of the circuit board 14 in the housing. Although the heat sink structure of Embodiment 6 has somewhat lower heat dissipating capabilities than that of Embodiment 5, Embodiment 6 allows the use of a wider range of electronic components than Embodiment 5 since no metal part 15 is present on the top surface of the circuit board 14. In addition, similar to Embodiment 5, Embodiment 6 offers a high-grade heat sink that: does not require tight control at the time of manufacturing; is structurally simple; can be produced at a higher production rate; is cost-effective; and has sufficient sealability (waterproof properties). It should be noted that in the heat sink structure of Embodiment 5, the metal part 15 can instead be provided on the top surface of the circuit board 14, or the circuit board 14 can instead be placed upside down in the housing so that the electronic component 13 faces downward.

Embodiment 7

Figure 21:
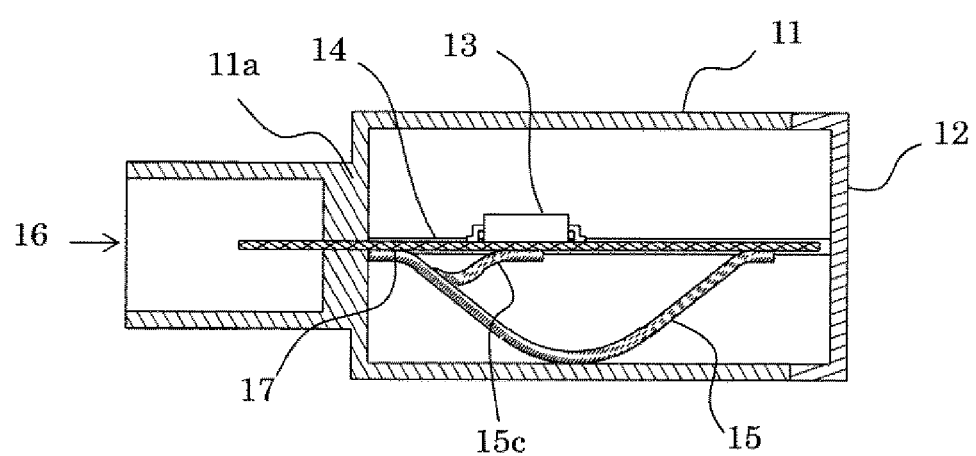
FIG. 21 is a cross-sectional side view illustrating the fundamental structure of an electronic control device according to Embodiment 7 of the invention.

FIG. 21 is a cross-sectional side view illustrating the fundamental structure of an electronic control device according to Embodiment 7 of the invention. The device of Embodiment 7 differs from that of Embodiment 2 shown in FIG. 6 in that it includes as a heat sink a heat sink piece 15*c* provided by local cutting in a single metal part 15 provided on the bottom side of the circuit board 14 within the housing and coming into contact with the position corresponding to the mounting part of the electronic component 13 (located closer to the partition wall 11*a* than in FIG. 6) on the bottom surface of the circuit board 14 and has the function of transferring the heat of electronic component 13 from the corresponding position on bottom surface of the circuit board 14 through the heat sink piece 15*c* and the main body of the metal part 15 to the housing to dissipate it to the outside by the metal part 15 supporting the bottom surface of the circuit board 14 in the housing. Incidentally, because the heat sink piece 15*c* is located close to the inserting section of the circuit board 14, the influence of deformation amount variations according to the bending amount of the metal part 15 is small when the circuit board 14 is slid into the housing base 11 after the heat sink piece 15*c* is attached to the circuit board 14.

In the heat sink structure of the electronic control device of Embodiment 7, the single metal part 15 disposed in the housing, connected to the bottom surface of the circuit board 14, and supporting the circuit board 14 from the bottom surface is provided with the heat sink piece 15*c* coming into contact with the corresponding position on the bottom surface of the circuit board 14 at which the electronic component 13 is mounted, and the function of transferring the heat of electronic component 13 from the corresponding position on bottom surface of the circuit board 14 through the heat sink piece 15*c* and the main body of the metal part 15 to the housing to efficiently dissipate it to the outside is obtained by the metal part 15 supporting the bottom surface of the circuit board 14 in the housing. Thus, the heat sink structure of Embodiment 7 has higher heat dissipating capabilities than that of Embodiment 2 shown in FIG. 6 and also allows the use of a wider range of electronic components than Embodiment 2 since no metal part 15 is present on the top surface of the circuit board 14. In addition, similar to the previous embodiments, Embodiment 7 offers a high-grade heat sink that: does not require tight control at the time of manufacturing; is structurally simple; can be produced at a higher production rate; is cost-effective; and has sufficient sealability (waterproof properties).

Embodiment 8

Figure 22:
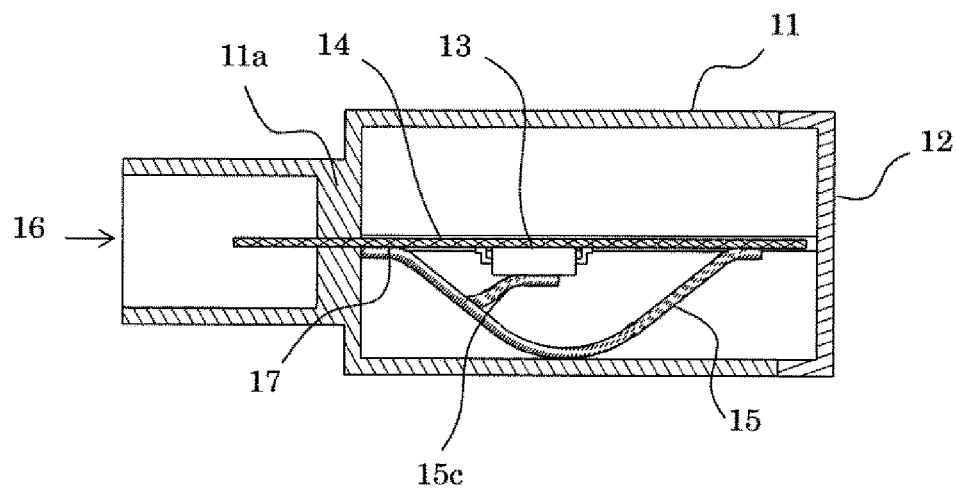
FIG. 22 is a cross-sectional side view illustrating the fundamental structure of an electronic control device according to Embodiment 8 of the invention.

FIG. 22 is a cross-sectional side view illustrating the fundamental structure of an electronic control device according to Embodiment 8 of the invention. The device of Embodiment 8 differs from that of Embodiment 7 shown in FIG. 21 in that it adopts the structure in which the circuit board 14 is placed upside down in the housing so that the electronic component 13 faces downward and has the function of directly transferring the heat of the electronic component 13 from the heat sink piece 15*c* itself through the main body of the metal part 15 to the housing to dissipate it to the outside by allowing the heat sink piece 15*c* to directly touch the electronic component 13 on the surface side of the circuit board 14.

In the heat sink structure of the electronic control device of Embodiment 8, the single metal part 15 disposed in the housing, connected to a surface of the circuit board 14, and supporting the surface of the circuit board 14 is provided with the heat sink piece 15*c* that directly touches the electronic component 13 themselves on the surface of the circuit board 14, and the function of transferring the heat of electronic component 13 from the heat sink piece 15*c* itself through the main body of the metal part 15 to the housing to efficiently dissipate it to the outside is obtained by the metal part 15 supporting the surface of the circuit board 14 in the housing. Thus, the heat sink structure of Embodiment 8 has higher heat dissipating capabilities than that of Embodiment 7 and also allows the use of a wider range of electronic components than Embodiment 7 since no metal part 15 is present on the top surface of the circuit board 14. In addition, similar to the previous embodiments, Embodiment 8 offers a high-grade heat sink that: does not require tight control at the time of manufacturing; is structurally simple; can be produced at a higher production rate; is cost-effective; and has sufficient sealability (waterproof properties).

Embodiment 9

Figure 23:
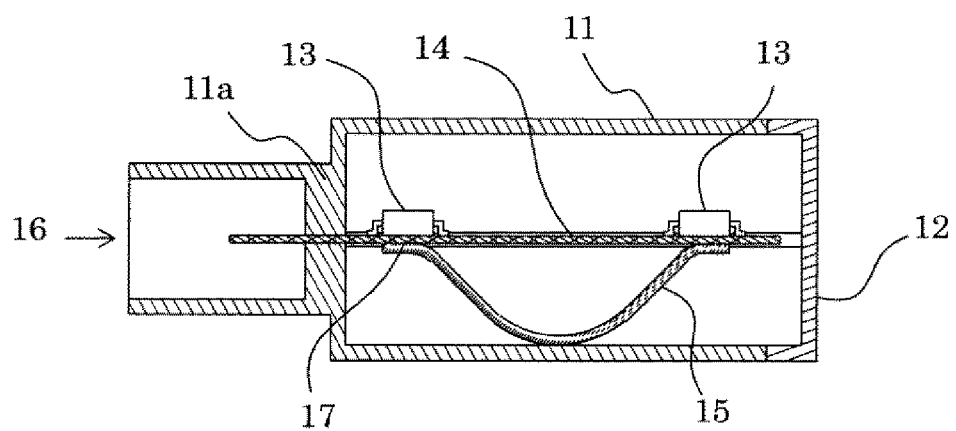
FIG. 23 is a cross-sectional side view illustrating the fundamental structure of an electronic control device according to Embodiment 9 of the invention.

FIG. 23 is a cross-sectional side view illustrating the fundamental structure of an electronic control device according to Embodiment 9 of the invention. The device of Embodiment 9 differs from that of Embodiment 2 shown in FIG. 6 in that two electronic components 13 are mounted on both sides on the top surface of the circuit board 14 in a lateral direction, and among the two positions on the bottom surface of the circuit board 14 corresponding to the mounting positions of the electronic components 13, one end of a metal part 15 is connected to the position on the side of the partition wall 11*a* with the use of the connecting material such as solder or adhesive, and the other end of the metal part 15 is bent and brought into contact with the other position on the side of the housing cover 12 when the circuit board 14 is slid into the housing base 11.

In the heat sink structure of the electronic control device of Embodiment 9, the metal part 15 connected to the bottom surface of the circuit board 14 and supporting the bottom surface of the circuit board 14 is disposed in the housing, and the function of transferring the heat of the electronic components 13 from the both end sides of the metal part 15 that touch the positions corresponding to the mounting positions through the main body of the metal part 15 to the housing to efficiently dissipate it to the outside is obtained by the metal part 15 supporting the bottom surface of the circuit board 14 in the housing. Thus, the heat sink structure of Embodiment 9 has heat dissipating capabilities similar to that of Embodiment 2 and also allows the use of a wider range of electronic components than Embodiment 2 since no metal part 15 is present on the top surface of the circuit board 14. In addition, similar to the previous embodiments, Embodiment 9 offers a high-grade heat sink that: does not require tight control at the time of manufacturing; is structurally simple; can be produced at a higher production rate; is cost-effective; and has sufficient sealability (waterproof properties).

Embodiment 10

Figure 24:
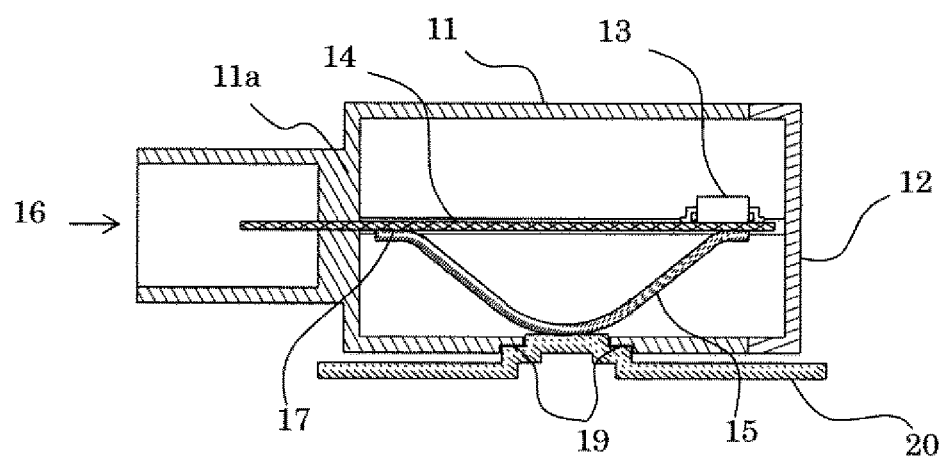
FIG. 24 is a cross-sectional side view illustrating the fundamental structure of an electronic control device according to Embodiment 10 of the invention.

FIG. 24 is a cross-sectional side view illustrating the fundamental structure of an electronic control device according to Embodiment 10 of the invention. The device of Embodiment 10 differs from that of Embodiment 9 shown in FIG. 23 in that a single electronic component 13 is mounted on the top surface of the circuit board 14 at a position on the side of the housing cover 12 in a lateral direction, one end of a single metal part 15 is connected to a position on the bottom surface of the circuit board 14 on the side of the partition wall 11a with the use of the connecting material 17 such as solder or adhesive, and the other end of the metal part 15 is bent and brought into contact with the position corresponding to the mounting position of the electronic component 13 on the side of the housing cover 12 when the circuit board 14 is slid into the housing 11, in that a wall surface of the housing base 11 in a lateral direction is partially open so that an external convex-shaped metal part 20 used for heat dissipation is attached, and in that as to the external metal part 20, its apex touches the metal part 15 when the external metal part 20 is attached to the opening, and a filler material 19 for sealing is present between a stepped section and a wall section near the opening.

In the heat sink structure of the electronic control device of Embodiment 10, the single metal part 15 connected to the bottom surface of the circuit board 14 and supporting the bottom surface of the circuit board 14 is disposed in the housing, the external metal part 20 is attached to the opening on a side surface of the housing, the metal part 15 supports the bottom surface of the circuit board 14 in the housing, the apex of the external metal part 20 supports the apex of the metal part 15, and the function of transferring the heat of the electronic component 13 from the other end of the metal part 15 connected to the position corresponding to the mounting position of the electronic component 13 through the main body of the metal part 15 to the external metal part 20 to efficiently dissipate it to the outside is obtained. Thus, the heat sink structure of Embodiment 10 has higher heat dissipating capabilities than those of the previous embodiments and also allows the use of a wider range of electronic components since no metal part 15 is present on the top surface of the circuit board 14. In addition, similar to the previous embodiments, Embodiment 10 offers a high-grade heat sink that: does not require tight control at the time of manufacturing; is structurally simple; can be produced at a higher production rate; and is cost-effective. Also, since the external metal part 20 is attached to the housing base 11 with the filler material 19 for sealing placed therebetween, a high-grade heat sink structure having sufficient sealability (waterproof properties) can be obtained. It should be noted that the heat sink structure of Embodiment 10 can be changed to the structure in which a metal part 15 is disposed also on the top surface of the circuit board 14 as in Embodiment 1 described with reference to FIGS. 1 through 5 and the other end of the metal part 15 directly touches the electronic component 13. The heat sink structure of Embodiment 1 can also be applied to a case where the circuit board 14 is placed upside down in the housing so that the electronic component 13 faces downward.

Embodiment 11

Figure 25:
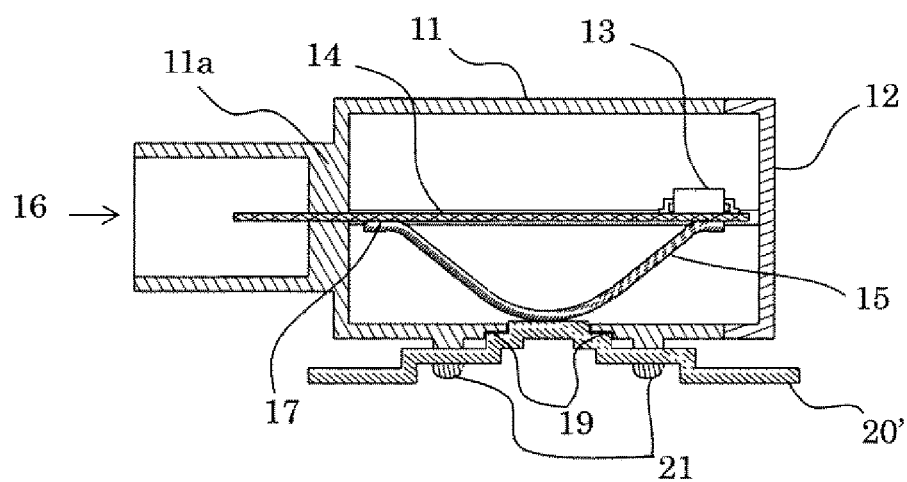
FIG. 25 is a cross-sectional side view illustrating the fundamental structure of an electronic control device according to Embodiment 11 of the invention.

FIG. 25 is a cross-sectional side view illustrating the fundamental structure of an electronic control device according to Embodiment 11 of the invention. The device of Embodiment 11 differs from that of Embodiment 10 shown in FIG. 24 in that an external convex-shaped metal part 20' has a section with which to fix the housing base 11 and the metal part 20' itself with the use of fastening members.

In the heat sink structure of the electronic control device of Embodiment 11, holes are punched at particular positions on the stepped section, slightly distanced from the opening, of the external metal part 20' touching the housing base 11 (the flat section present on the apex section side among the stepped flanges on the bottom side), screw holes are provided at the positions of the housing base 11 corresponding to the positions of the holes, and fastening is performed with the use of caulking screws 21 which are the fasting members for fixing the external metal part 20' and the housing base 11, thereby fixing the external metal part 20' to the housing cover 12 and the housing base 11. This results in a housing product having the metal part 20', which can be mounted in another device to facilitate heat transfer.

Embodiment 12

Figure 26:
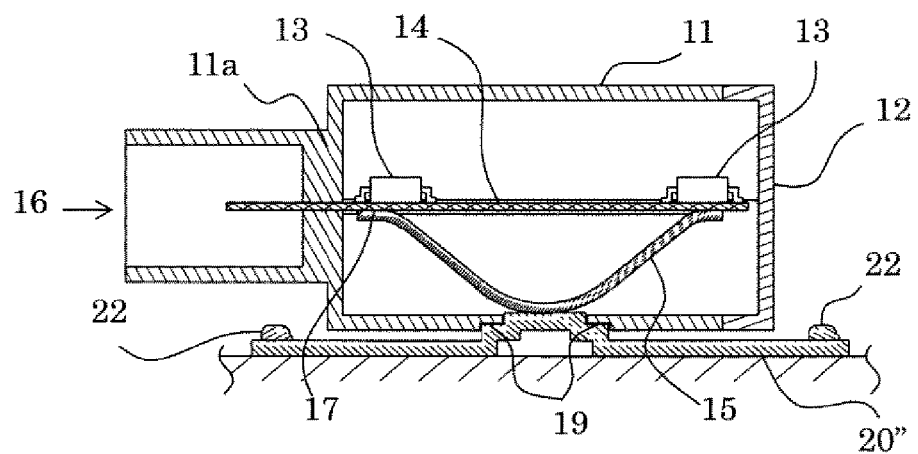
FIG. 26 is a cross-sectional side view illustrating the fundamental structure of an electronic control device according to Embodiment 12 of the invention.

FIG. 26 is a cross-sectional side view illustrating the fundamental structure of an electronic control device according to Embodiment 12 of the invention. The device of Embodiment 12 differs from that of Embodiment 10 shown in FIG. 24 in that two electronic components 13 are mounted on both sides on the top surface of the circuit board 14 in a lateral direction, and an external metal part 20" is fixed by fastening members to an external member after the external convex-shaped metal part 20" is attached to the opening of the housing base 11.

In the heat sink structure of the electronic control device of Embodiment 12, holes are punched at mutually distant particular positions of the external metal part 20" that are not brought into contact with the housing base 11, screw holes are provided at the positions of the external member corresponding to the positions of the holes, and fastening is performed with the use of screws 22 which are the fastening members for fixing the external metal part 20" and the external member, thereby fixing the external metal part 20" connected to the housing cover 12 and the housing base 11 to the external member. This results in a housing product having the metal part 20", which can be mounted in another device to facilitate heat transfer.

DESCRIPTION OF REFERENCE CHARACTERS

11: Housing base
11a: Partition wall
11b, 11b': Insertion hole
11c: Guide groove
12: Housing cover
13: Electronic component
14: Circuit board
15: Metal part
15a: Bent section
15b: Anti-displacement bent section
15c: Heat sink piece
16: Connector inserting section
17: Connecting material
18: Fastening member
19: Filler material 20, 20', 20": External metal part
21: Caulking screw
22: Screw

The invention claimed is:

1. An electronic control device comprising:
a housing having a housing base with opposed inner wall surfaces, a partition wall with an insertion hole, and a connector inserting section used for electrical connection with an external mating connector;
a circuit board having an electronic component thereon, wherein the circuit board has an insertable side and is insertable through the insertion hole of the partition wall so that the part of the circuit board is exposed within the connector inserting section; and
an elastic metal part disposed in the housing, the elastic metal part has a first distal end and a second distal end, the first distal end being connected to a first position on the insertable side of the circuit board and supports the circuit board.

2. The electronic control device of claim 1, wherein an engagement position used for connecting the elastic metal part and the circuit board is provided on the elastic metal part or the circuit board.

3. The electronic control device of 1, wherein the elastic metal part supports the circuit board at two locations or more on one side of the circuit board and the elastic metal part is supported at one location or more on the inner wall surface of the housing.

4. The electronic control device of claim 1, wherein the elastic metal part transfers heat generated from the electronic component to the circuit board or transfers the heat generated from the electronic component to the housing in order to dissipate the heat.

5. The electronic control device of claim 1, wherein a portion of the elastic metal part that is located close to another portion of the elastic metal part that is in contact with the circuit board is partially cut off.

6. The electronic control device of claim 1,
wherein an inner wall surface of the housing base in a lateral direction is partially open so that an external convex-shaped metal part used for heat dissipation is attached,
wherein the apex of the external convex-shaped metal part is in contact with the elastic metal part when the external convex-shaped metal part is attached to the partial opening of the housing base, and
wherein a filler material for sealing is present between a stepped section and a wall section near the opening.

7. The electronic control device of claim 1,
wherein the housing base integrally has the connector inserting section and the partition wall and being open on an edge side across from the partition wall; and
a housing cover attached to the opening on the edge side of the housing base, and
wherein the circuit board on which the electronic component is mounted and to which the elastic metal part is attached slides into the housing base to insert an edge section of the circuit board into the insertion hole of the partition wall so that part of the circuit board is exposed inside the connector inserting section, and the housing cover attaches to the housing base.

8. The electronic control device of claim 7, wherein the elastic metal part includes anti-displacement bent sections that touch side surfaces of the circuit board at different positions so that displacement is prevented when the circuit board is slid into the housing base.

9. The electronic control device of claim 7, wherein the elastic metal part includes a heat sink piece coming into contact with a position corresponding to a mounting position of the electronic component on the circuit board or the electronic component when the circuit board is slid into the housing base, the heat sink piece being provided by local cutting.

10. The electronic control device of claim 7, wherein the housing base and the housing cover are made of resin.

11. The electronic control device of claim 7, wherein the housing cover is made of metal.

12. The electronic control device of claim 1, wherein the elastic metal part has an arch shape.

13. The electronic control device of claim 12, wherein:
when the circuit board is inserted into the housing base, an apex of the arch shape of the elastic metal part contacts an inner wall surface of the housing base and the second distal end of the elastic metal part contacts a second position on the circuit board, and
when the circuit board is outside the housing base, the second distal end of the elastic metal part separates from the second position on the circuit board.

* * * * *